United States Patent
Kazama

(10) Patent No.: US 7,157,922 B2
(45) Date of Patent: Jan. 2, 2007

(54) PLANAR ELECTROCONDUCTIVE CONTACT PROBE HOLDER

(75) Inventor: Toshio Kazama, Nagano (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 10/510,615

(22) PCT Filed: Apr. 16, 2003

(86) PCT No.: PCT/JP03/04838

§ 371 (c)(1),
(2), (4) Date: May 26, 2005

(87) PCT Pub. No.: WO03/087853

PCT Pub. Date: Oct. 23, 2003

(65) Prior Publication Data

US 2005/0258843 A1    Nov. 24, 2005

(30) Foreign Application Priority Data

Apr. 16, 2002   (JP)   ............................. 2002-113485

(51) Int. Cl.
*G01R 31/00* (2006.01)
(52) U.S. Cl. ...................... 324/754; 324/761
(58) Field of Classification Search ........ 324/754–762, 324/72.5; 439/482, 824
See application file for complete search history.

(56) References Cited

U.S. PATENT DOCUMENTS

| 4,322,682 A | * | 3/1982 | Schadwill | ................... | 324/761 |
| 4,423,376 A | * | 12/1983 | Byrnes et al. | ............... | 324/756 |
| 5,521,523 A | | 5/1996 | Kimura et al. | | |
| 5,804,984 A | | 9/1998 | Alcoe et al. | | |
| 6,051,982 A | | 4/2000 | Alcoe et al. | | |
| 2002/0123252 A1 | | 9/2002 | Yu et al. | | |

FOREIGN PATENT DOCUMENTS

| JP | 60-168062 | 8/1985 |
| JP | 01 213579 A | 8/1989 |
| JP | 8-201427 | 8/1996 |
| JP | 8-271547 | 10/1996 |
| JP | 2001-223247 | 8/2001 |

(Continued)

OTHER PUBLICATIONS

English Language Abstract, Japanese Publication No. 60-168062, Published Aug. 31, 1985, 1 p.
English Language Abstract, Japanese Publication No. 8-201427, Published Aug. 9, 1996, 1 p.

(Continued)

*Primary Examiner*—Vinh P. Nguyeh
(74) *Attorney, Agent, or Firm*—MacPherson Kwok Chen & Heid LLP; David S. Park

(57) ABSTRACT

An opening 5a is formed in a part of a high strength base plate 5 for providing electroconductive contact units, and a holder hole forming member 7 made of plastic material is filled into the opening via an insulating film 6. Holder holes 2 are formed in the holder hole forming member, and a coil spring 8 and electroconductive needle members 9 and 10 are installed in each holder hole. Because the proportion of the reinforcing material in the thickness of the holder is so high that the contact probe holder can be made almost as strong as the high strength base plate. Thus, even when the thickness of the holder is minimized, the mechanical strength of the holder can be ensured as opposed to the conventional arrangement including a simply insert molded metallic member, and the holder can be made even thinner.

18 Claims, 8 Drawing Sheets

FOREIGN PATENT DOCUMENTS

WO     WO 98/11446     3/1998
WO     WO 00/03250     1/2000

OTHER PUBLICATIONS

English Language Abstract, Japanese Publication No. 8-271547, Published Oct. 18, 1996, 1 p.

English Language Abstract, Japanese Publication No. 2001-223247, Published Aug. 17, 2001, 1 p.

Microfilm of the specification and drawings annexed to the request of Japanese Utility Model Application No. 36820/1989 (Laid-open No. 128961/1990) (Tsuneo Kasahara), Oct. 24, 1990, Fig. 1.

Microfilm of the specification and drawings annexed to the request of Japanese Utility Model Application No. 93110/1990 (Laid-open No. 51663/1992) (Organ Needle Co., Ltd.), Apr. 30, 1992, Fig. 8.

English Language Abstract, Japanese Publication No. JP1213579, Aug. 28, 1989, 1 page.

\* cited by examiner

PLANAR ELECTROCONDUCTIVE CONTACT PROBE HOLDER

TECHNICAL FIELD

The present invention relates to an electroconductive contact probe holder for an electroconductive contact probe that can be used for testing components associated with semiconductor devices.

BACKGROUND OF THE INVENTION

Various tests that are conducted on components associated with semiconductor devices include a burn-in test that involves application of a voltage for a prolonged period of time (from a few hours to tens of hours) at a high temperature (approximately 150° C.). Because conducting a burn-in test on a package level is not efficient, it is more desirable to carrying out a burn-in test of a wafer level (by using a wafer having a diameter of 200 mm, for instance). In such a wafer level burn-in test, an electroconductive contact probe capable of simultaneously accessing a plurality of points is required.

Each contact unit that is used in the electroconductive contact probe is desired to have a structure that can accommodate variations in the height of the electrodes on the wafer by applying the needle member to the corresponding electrode in a resilient manner, and such an example is illustrated in FIG. 8. As shown in the drawing, a stepped holder hole 2 is formed across the thickness of a support member 21 in the form of a plate member, and an electroconductive needle member 23 is received in a small diameter hole 2a of each holder hole 2 so as to be moveable into and out of the holder hole 2 while a large diameter hole 2b of the holder hole 2 receives an electroconductive coil spring 24. The needle member 23 is provided with a radial flange 23a received in the large diameter hole 2b and one end of the coil spring 24 is wrapped around a stem portion 23b extending from the radial flange 23a so that the needle member 23 is resiliently urged by the coil spring 24. The other end of the coil spring 24 resiliently engages a corresponding terminal 25a of a circuit board 25 placed over the support member 21. These terminals 25a are connected to an electric circuit of the testing device.

By arranging such electroconductive contact units in the support member in a mutually parallel relationship, a contact probe capable of simultaneously accessing a plurality of points can be obtained. By applying the tip of each needle member 23 of the contact probe to the corresponding electrode 26a of the wafer 26 (object to be tested) so that the electric testing on a wafer level can be carried out.

To simultaneously access a plurality of electrodes 26a on a wafer 26, it is necessary that a same number of electroconductive contact units are provided in the support member in the same arrangement as the electrodes 26a on the wafer 26. Thus, a contact probe may be required to have a large number of contact units in a highly dense arrangement in a planar support member. However, owing to the combined pressure from the contact units, the positional accuracy of the contact units could be impaired owing to the warping or other deformation of the support member. In such a case, the positional errors in the contact points may create a serious problem.

As a countermeasure against such a problem, it is proposed in Japanese patent application 2000-33443 by the same applicant to incorporate a metallic reinforcing member in the support member made of plastic material by insert molding. Such an example is illustrated in FIG. 9. Small diameter holes are formed in a support member 28 incorporated with a reinforcing member 27, and each receive a stem portion of one of a pair of electroconductive needle members 28, both of which are intended to be moveable, so as to be moveable into and out of the hole. The coil spring 30 and the other electroconductive needle member 29 are provided in a large diameter hole and a stepped hole provided in the remaining plastic support members 32 and 33 which are laminated one over another. According to this arrangement, owing to the increased mechanical strength of the support member 28 by virtue of the reinforcing member 27, positional errors such as those mentioned above can be avoided.

However, as the frequency of the test signals rises, the contact probe is required to be adapted to such high frequency signals. It can be accomplished by reducing the total length (length of the signal path), and it requires the thickness of the support member (axial length of the contact probe) to be reduced accordingly. As it means a decrease in the thickness of both the support member and reinforcing member, the mechanical strength of the support member may be undesirably reduced.

When the support member is formed with plastic material and insert molded with a reinforcing member as described above, the thickness of the plastic material that covers the reinforcing member has to be reduced. Therefore, as the thickness of the support member is reduced, the proportion of the plastic material in the overall thickness of the support member tends to be increased, and this imposes a limit to an effort to minimize the thickness of the support member.

BRIEF SUMMARY OF THE INVENTION

In view of such problems of the prior art, a primary object of the present invention is to provide a contact probe holder that can be reduced in thickness without compromising the mechanical strength thereof.

A second object of the present invention is to provide a contact probe holder that can ensure a high level of positional precision to the contact points while simplifying the manufacturing process.

A third object of the present invention is to provide a contact probe holder that is favorable in terms of both electric and mechanical properties.

According to the present invention, at least most of the objects can be accomplished by providing an electroconductive contact probe holder for supporting a plurality of contact units for contacting an object, comprising: a base plate member made of a first material and provided with an opening therein; and a holder hole forming member made of a second material and filled in said opening substantially without extending outside said opening; a plurality of holder holes being passed across a thickness of said holder hole forming member each for receiving a contact unit therein.

When metallic member is simply insert molded in plastic material according to the conventional arrangement, the plastic material is prevented from coming off from the opening by being connected by the plastic material on the front and back sides of the metallic member, but the thickness of the metallic member is reduced by the thickness of the plastic material on the front and back sides of the metallic member. On the other hand, according to the present invention, because the holder hole forming portion is required to occupy only the interior of the opening, and the thickness of the holder can be made equal to the thickness of the high strength support member, and a required mechanical strength can be achieved without any difficulty. In particular, because the holder holes for the contact probe can be formed in material suitable for forming such holes and a high positional accuracy can be achieved, the holder is highly suitable for use in contact probes for testing highly integrated chips.

If said first material comprises a member selected from a group consisting of metallic material, semiconductor material, ceramic material and glass material, and said second material comprises a plastic material, the contact probe holder becomes favorable in terms of both electric and mechanical properties, and a high level of positional precision can be ensured to the contact points while simplifying the manufacturing process.

In particular, film made of such material that promotes bonding and/or electric insulation between said holder hole forming member and said base plate may be formed over an inner circumferential surface of said opening. Thereby, the freedom of selection of the materials for the various parts of the contact probe can be increased. If an engagement feature is formed on an inner circumferential surface of said opening, the holder hole forming member can be firmly secured in the opening. If said base plate member is made of a silicon wafer, the engagement feature may comprise an inwardly directed ridge formed by anisotropically etching said inner circumferential surface of said opening.

If a stress relieving opening is formed in a part of the base plate adjacent said opening having said holder hole forming portion filled therein, the deformation of the holder hole forming portion which his not desirable for ensuring the high precision of the contact points can be avoided even when a relative difference in deformation exists between the holder hole forming portion and base plate owing to the difference in thermal expansion or aging.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
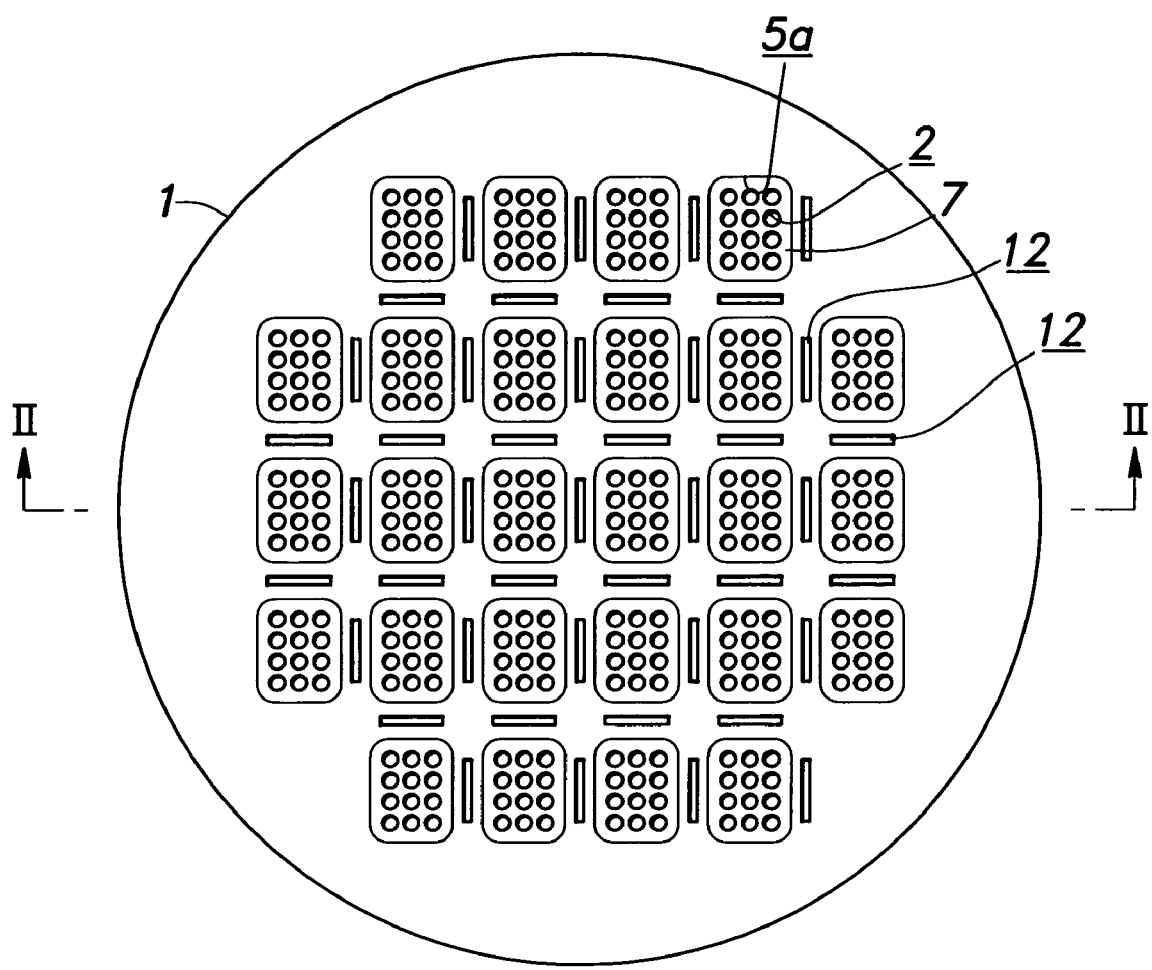
FIG. 1 is a plan view of a contact probe holder for use in a contact probe unit embodying the present invention.

FIG. 1 is a plan view of a holder 1 for electroconductive contact units in a contact probe embodying the present invention. When the object to be tested consists of an 8-inch wafer, for instance, the holder 1 may consist of a disk having a diameter of eight inches (approximately 200 mm). An 8-inch wafer typically produces tens to hundreds of semiconductor chips. A 12-inch wafer (approximately 300 mm) typically produces thousands of semiconductor chips.

Referring to FIG. 1, the holder 1 for an electroconductive contact probe is circular in shape in plan view similarly as the wafer that is to be tested, and is provided with a plurality of holder holes 2 for receiving a plurality of electroconductive contact units at positions that correspond to the electrodes of the chips formed in the wafer as is the case with the prior art. In the drawing, the holder holes 2 are illustrated in a somewhat exaggerated manner, and are smaller in number than actually are.

Figure 2:
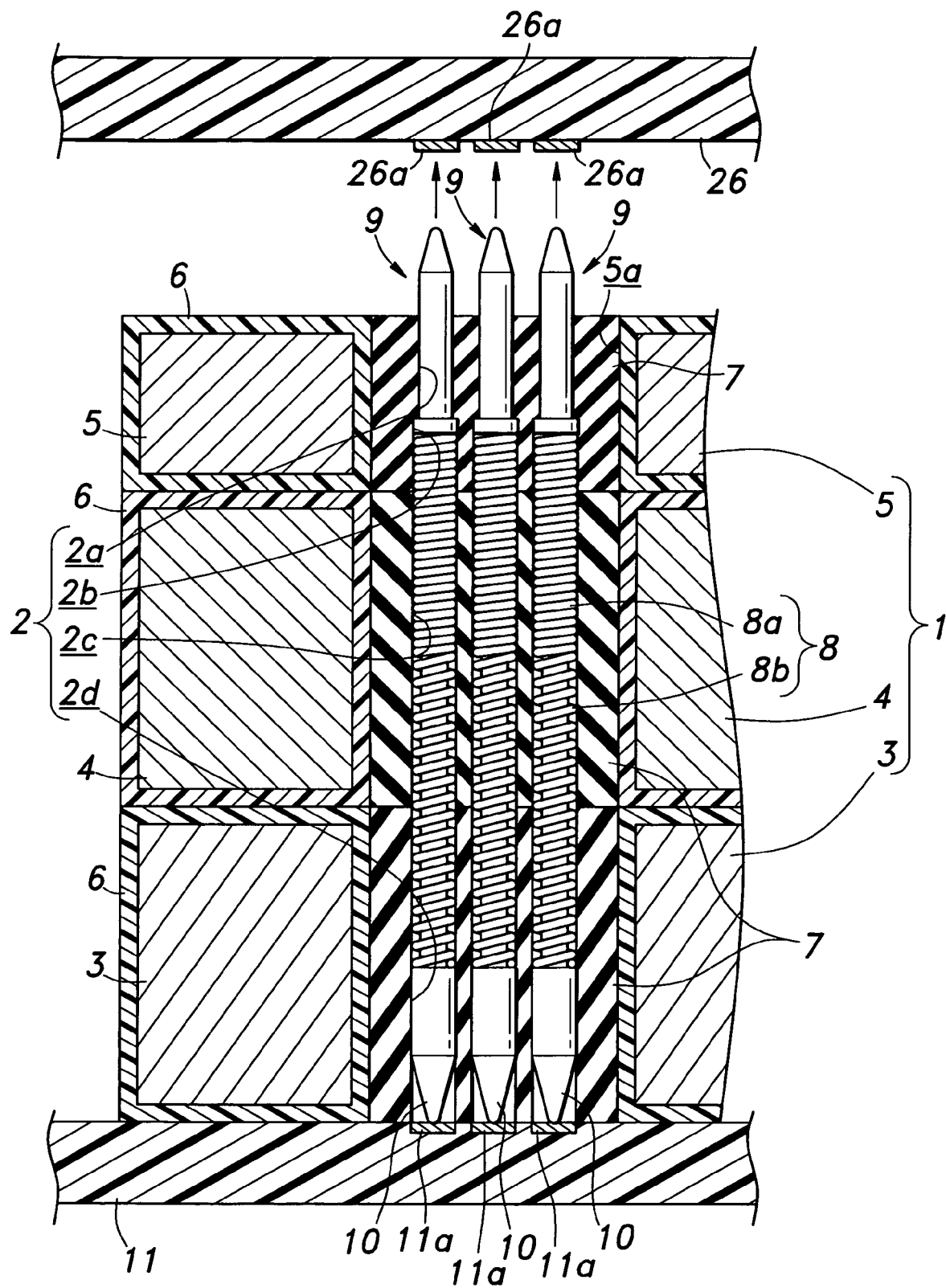
FIG. 2 is a fragmentary longitudinal sectional view of the contact probe unit taken along line II—II of FIG. 1.

FIG. 2 is a fragmentary longitudinal sectional view taken along line II—II of FIG. 1 showing exemplary electroconductive contact units embodying the present invention. As shown in FIG. 2, three base plates 3, 4 and 5 having a same shape as seen in the plan view of FIG. 1 are layered as an upper, middle and lower layer so as to form a three-layered holder 1 for an electroconductive contact probe.

Figure 3A:
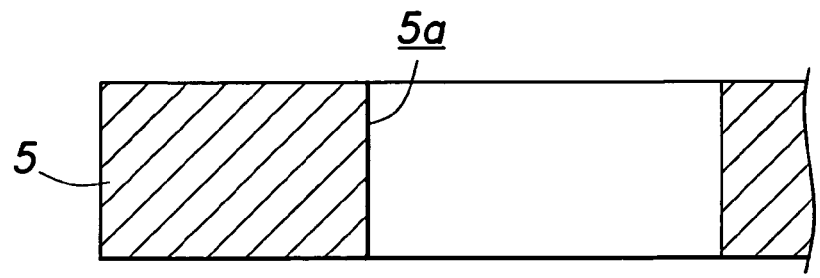
FIG. 3a is a fragmentary longitudinal sectional view of the mode of forming openings in the high strength support member.

The base plates 3, 4 and 5 may be all made of a same material, and the mode of preparing a base plate 5 is described in the following with reference to FIG. 3. With reference to FIG. 3a, openings 5a are formed in a high strength base plate 5 by etching, laser, blanking or other mechanical process so as to correspond to the individual chips in the wafer that is to be tested. The high strength material for the base plate 5 may consist of metallic material having a low coefficient of thermal expansion such as invar and covar. If desired, the base plate may be made of ceramic, glass, silicon or other semiconductor or composite material having a desired mechanical properties.

Figure 3B:
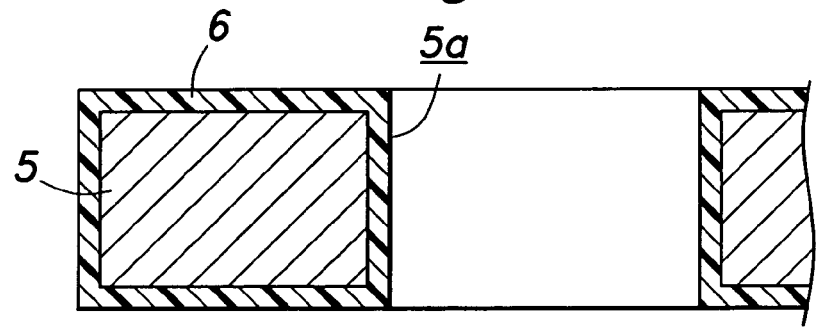
FIG. 3b is a view showing the insulating film formed over the high strength support member.
Figure 3C:
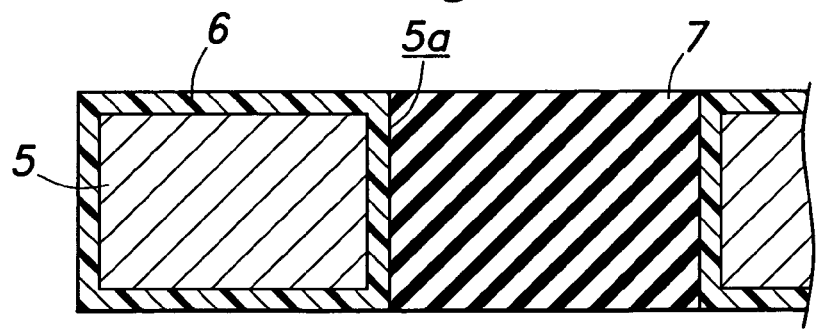
FIG. 3c is a view showing the holder hole forming portion filled in the opening of the base plate.

Referring to FIG. 3b, relatively thin film 6 (tens or hundreds of μm thick) made of such material as insulating plastic material is coated on the surface of the high strength base plate 5 having the openings 5a. The possible methods of coating may include calendar process, extrusion, immersion, spraying, spreading and electrostatic deposition. Referring to FIG. 3c, a holder hole forming portion 7 made of plastic material or the like that is suitable for machining or otherwise forming the holder holes for the contact probe is filled into each of the openings 5a. The film 6 demonstrates a high bonding strength with respect to the plastic material. By providing such film 6 on the inner circumferential surface of each opening 5a, the high strength base plate 5 and the plastic holder hole forming portions 7 filled in the openings 6a can be firmly joined to each other.

Figure 3D:
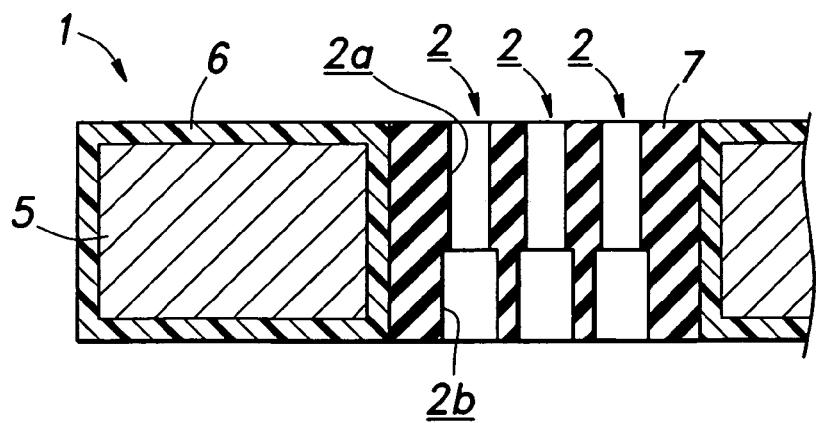
FIG. 3d is a view showing the support member formed with the holder holes.

Referring to FIG. 3d, a plurality of holder holes 2 for contact units are formed in each holder forming portion 7 so as to correspond to each individual chip.

Figure 4:
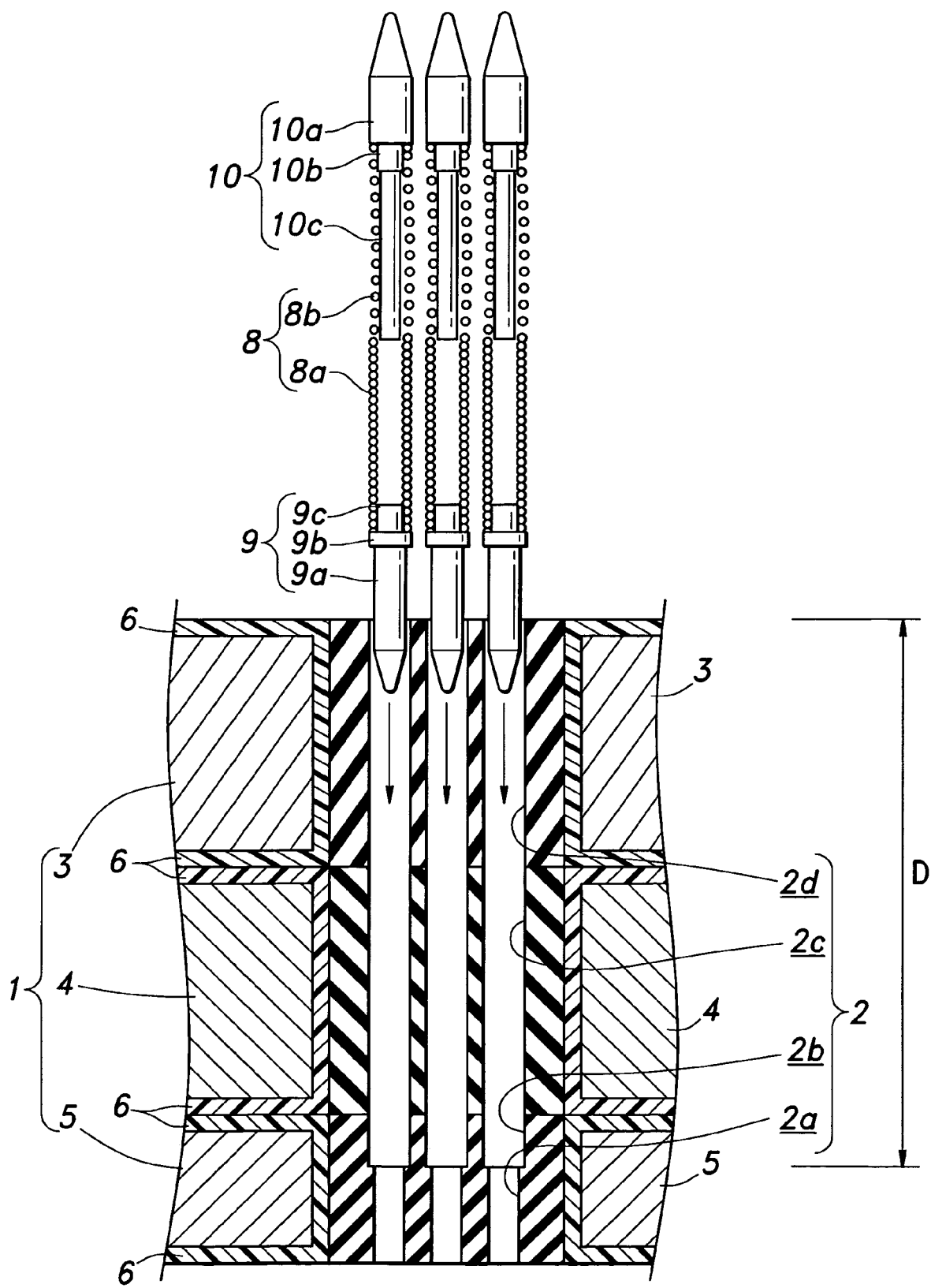
FIG. 4 is a view showing the mode of assembling the coil springs and needle members in the contact probe holder.

As shown in FIGS. 2 and 4, the base plate 5 is formed with a plurality of stepped holes each including a small diameter hole 2a and a large diameter hole 2b that are disposed coaxial to each other. The other base plates 3 and 4 are formed with a plurality of straight holes 2c and 2d each having a same diameter as the large diameter hole 2b. Each holder hole 2 is formed jointly by the corresponding stepped hole (2a and 2b) and straight holes (2c and 2d).

The base plates 3, 4 and 5 are held in position in the laminated state as illustrated in FIG. 2 by using threaded bolts or the like not shown in the drawing.

The use of threaded bolts for securing the laminated assembly allows the assembly to be taken apart and reassembled with ease for maintenance and other purposes.

Referring to FIG. 4, the conductive part of each contact unit comprises an electroconductive coil spring 8 and pair of electroconductive contact needle members 9 and 10 provided on either end of the coil spring 8 with their free ends directed away from each other. One of the (or the lower) needle members 9 comprises a needle portion 9a having a pointed end that is directed downward in the drawing, a flange portion 9b having an enlarged diameter as compared with the needle portion 9a and a boss portion 9c projecting from the flange portion 9b away from the needle portion 9a (upward) all of which are disposed coaxial to one another. The other (or the upper) needle member 10 comprises a needle portion 10a having a pointed end that is directed upward in the drawing, a boss portion 10b having a smaller diameter than the needle portion 10a and a stem portion 10c projecting from the boss portion 10b away from the needle portion 10a (downward) all of which are again disposed coaxial to one another.

The coil spring 8 comprises a closely wound portion 8a in a lower part thereof and a coarsely would portion 8b in an upper part thereof as seen in FIG. 4. The boss portion 9c of one of the needle member 9 fits into a coil end defined by the closely wound portion 8a, and the boss portion 10b of the other needle member 10 fits into the other coil end defined by the coarsely wound portion 8b. These boss portions 9b and 10c may be engaged by the corresponding ends of the coil spring 8 by virtue of the winding force of the coil spring or by solder. When solder is used, the fit between the boss portions 9b and 10c and the corresponding coil ends may be a loose one.

In the installed state of the coil spring 8 and electroconductive needle members 9 and 10 shown in FIG. 4, when the coil spring 8 is unstressed and extends by the natural length thereof, the free end of the stem portion 10c substantially coincides with the end of the closely wound portion 8a adjoining the coarsely wound portion 8b. Thereby, as the coil spring 8 curves as it is compressed during use for testing, the closely wound portion 8a comes into contact with the stem portion 10c so that the electric signal conducted between the two needle members 9 and 10 is allowed to flow through the closely wound portion 8a and stem portion 10c without flowing through the coarsely would portion 8b. Thereby, the electric signal is allowed to flow axially or straight between the two needle members 9 and 10, and this makes the contact unit highly desirable for the testing of new generation chips involving high frequencies.

The integrally joined assembly of the coil spring 8 and electroconductive needle members 9 and 10 is installed in the base plates (3, 4 and 5) by introducing it into the holder hole 2 as indicated by the arrow in FIG. 4. The contact unit may be used in an inverted orientation as illustrated in FIG. 4, as opposed to the orientation illustrated in FIG. 2. Even in such a case, by installing the assembly of the coil spring 8 and electroconductive needle members 9 and 10 as illustrated in FIG. 4, the assembly is prevented from coming off from the holder hole 2 by the flange portion 9b of one of the needle members 9 being engaged by the shoulder defined between the small diameter hole 2a and large diameter hole 2b.

In the installed state illustrated in FIG. 2, a circuit board 11 of the testing device is attached to the lower side of the contact probe, for instance by using threaded bolts with the stepped diameter hole of the holder 1 facing up and the straight hole of the holder hole 2 facing down. The circuit board 11 is provided with terminals 11a at positions corresponding to the needle members 10. In the installed state illustrated in FIG. 2, the needle portion 10a of each needle member 10 engages the corresponding terminal 11a, and this prevents the assembly consisting of the coil spring 8 and needle members 9 and 10 from coming off from the holder hole 2 with the straight hole facing downward.

As shown in FIG. 2, the needle portion 9a of the upper needle member 9 projects upward. By applying the contact probe toward a wafer 26 to be tested as indicated by the arrow in the drawing until the needle portions 9a come into contact with the corresponding electrodes 26a and the needle portions 9a and 10 are resiliently engage the corresponding electrodes 26a and terminals 11a. The wafer 26 can be electrically tested by using the contact probe in this manner.

This arrangement enables the main component of the contact probe holder to be made of high strength base plates 3, 4 and 5, and the holder 1 may be provided with a level of mechanical strength comparable to the metallic material that is used for the high strength base plates 5. Forming the film 6 on the high strength base plate 5 can be most easily carried out by coating the film 6 over the entire surface of the high strength base plate 3, 4 and 5. If the film 6 is made of a highly insulating material, the entire surface of the high strength base plate 5 will be given with an insulating property. The film 6 defines a certain thickness on each of the front and back surfaces of the high strength base plate 5, but it is far less than the thickness of the plastic material that would cover the high strength base plate 5 by insert molding. Therefore, when a same metallic member having a same mechanical strength is used for the same high strength base plate 5, the holder made by coating the film 6 over the high strength base plate 5 can be made thinner than the corresponding holder made by insert molding by the thickness of the plastic material that would cover the metallic reinforcing member for insert molding.

This arrangement is particularly advantageous when a relatively thin base plate having a thickness in the order of 1 mm is used for a large holder (having a diameter in the range of 200 to 300 mm). When the holder is made by simple insert molding, the thickness of the plastic material covering the reinforcing metallic member inevitably accounts for a significant part of the total thickness when the thickness of the holder is as small as 1 mm. It would be extremely difficult to shave or otherwise remove the plastic layer to a thickness comparable to that of coated film, and would sharply increase the manufacturing cost. According to the present invention, a very thin holder can be made relatively easily, and a rise in the manufacturing cost can be avoided.

Referring to FIG. 1, a slit 12 is formed between adjacent openings 5a of the high strength base plate 5. Each slit 12 extends along each side of each rectangular opening 5a in the illustrated embodiment, but may also be formed in other manner, for instance as a cross-shaped slit provided centrally of adjoining corners of the rectangular openings 5a. By using such an arrangement, even when the contact probe is used in a burn-in or other test involving an environment characterized by large variations in temperature and the frame parts surrounding each opening 5a is pushed out owing to the thermal expansion of the corresponding holder hole forming portion 7, the slits 12 formed in the high strength base plate 5 can favorably accommodate the thermal expansion. Therefore, loss of positional precision of the contact points of the contact probe for each individual chips owing to the change in the pitch between the adjoining holder hole forming portions 7 by thermal expansion can be avoided. When the outer periphery of the base plate is retained by a frame member, the thermal expansion of the holder 1 may cause the holder 1 to warp into a dome shape, but the slits prevent such warping from occurring. Thus, by simply providing slits 12, there is provided a contact probe holder that can be used favorably for wafer level burn-in tests.

This structure can also be applied to a socket for mounting a chip on a circuit board. In a socket of this type, as the terminals of the chip get denser, the needle members (and coil springs) on the side of the socket get closer to one another, and the parts separating the adjacent holder holes 2 in each holder hole forming portion 7 become thinner. Therefore, when an electrostatic measure is required, the material for the holder hole forming portion 7 is required to have a favorably electrostatic property. However, readily available plastic materials which have a favorable electrostatic property are generally poor in electrically insulating properties. However, by using material having favorable electrically insulating properties as the material for the film 6, electric insulation in the holder can be ensured. By using a material having a favorable electrostatic property for the holder hole forming portion 7, a required electrostatic property can be ensured when the holder holes are densely arranged. Thus, a suitable material can be used for the holder hole forming portion 7 according to the particular application, and the range of application of the contact probe can be expanded.

Figure 5:
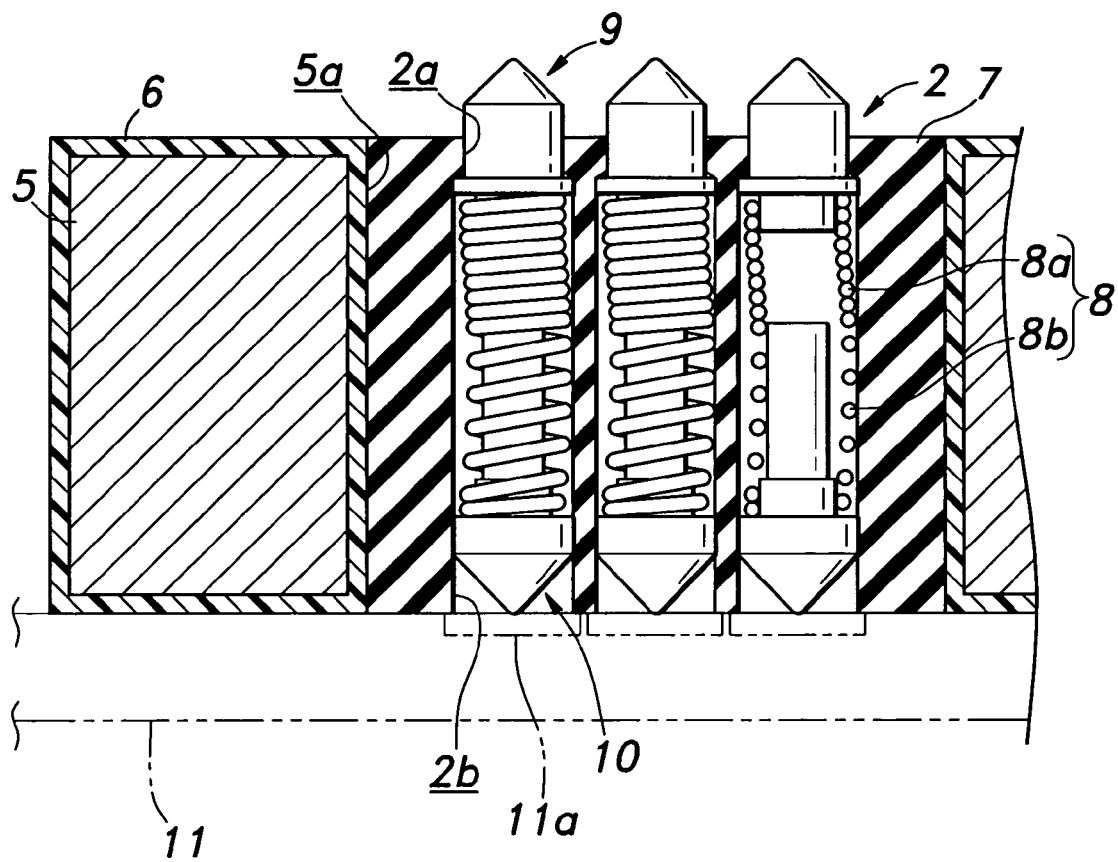
FIG. 5 is a view similar to FIG. 2 showing a second embodiment of the present invention.

In the foregoing embodiment, the contact probe holder was provided with a three-layered structure including three base plates 3, 4 and 5, but may also consist of a single base plate depending on the size and pitch of the holder holes. Such a single layered structure is illustrated in FIG. 5. The base plate 5 shown in FIG. 5 may be similar to the base plates of the previous embodiment, and the parts corresponding to those of the previous embodiment are denoted with like numerals without repeating the description of such parts.

The contact probe holder illustrated in FIG. 5 is provided with holder holes 2 each defined by a stepped diameter hole formed in a single base plate 5, and a coil spring 8 and a pair of electroconductive needle members 9 and 10 are received in each holder hole 2. When no significant stroke is required for one of the needle members 9, the coarsely wound portion 8b of the coil spring 8 is not required to be so long, and the holder 1 may consist of a single-layered structure including only one base plate 5. In such a case, the thickness of the holder 1 can be reduced even further.

Figure 6:
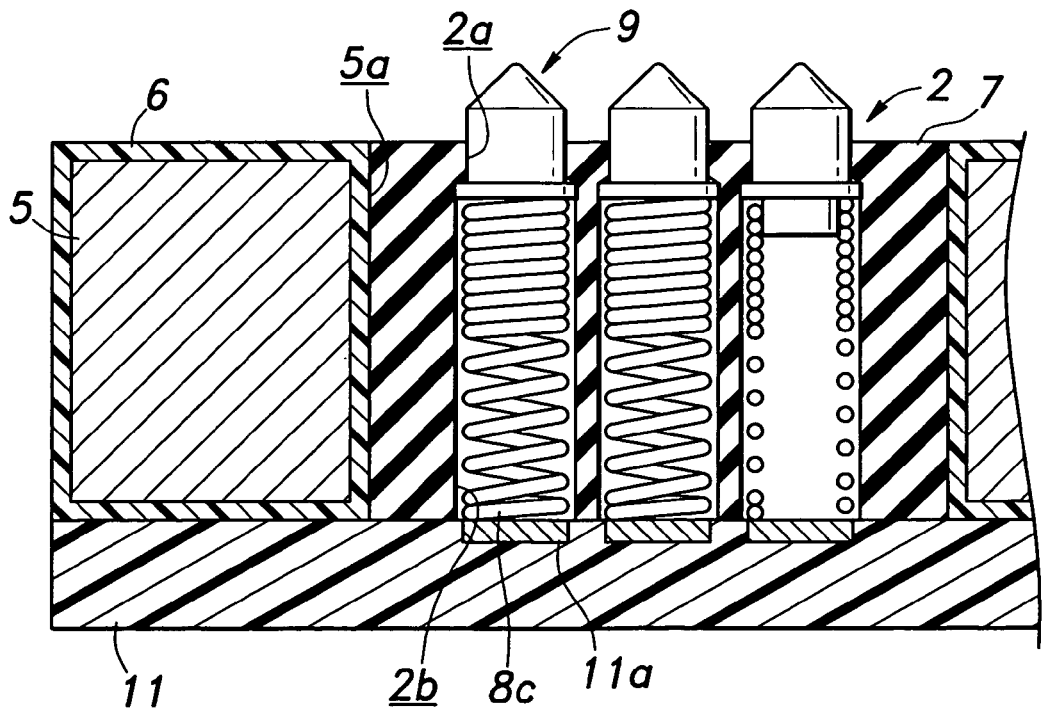
FIG. 6 is a view similar to FIG. 5 showing a third embodiment of the present invention.

Electroconductive contact means on either end of each coil spring 8 consisted of a pair of needle members 9 and 10 in the foregoing embodiment, but the contact means on either end of each coil spring 8 facing the circuit board 11 may consist of a coil end 12 (the coil end of the coarsely wound portion in the illustrated embodiment) as illustrated in FIG. 6 so as to apply this coil end 12 to the corresponding terminal 11a. This reduces the number of needle members that are required, and contributes to the reduction in the manufacturing cost by minimizing the number of component parts and the amount of required assembly work. The embodiment illustrated in FIG. 6 consists of a single layer structure corresponding to the embodiment illustrated in FIG. 5, but may also consist of a three layer structure including three base plates 3, 4 and 5. In such a case also, the coil ends may be similarly adapted to be applied to the terminals 11a.

Without regard to if the holder consists of a single base plate or a plurality of base plates or how the structures of the coil spring and electroconductive contact members may be, the structure for the base plate according to the present invention is highly effective in increasing the mechanical strength of the base plates. For instance, thin insulating film 6 can be easily formed by spraying or dipping. Because the material for the hole forming portion in which the holder holes are formed may consist of plastic material suitable for forming such holes, the holder holes 2 can be formed at high precision without any difficulty, and a base plate having a generally high mechanical strength can be obtained with the added advantage of high productivity.

Although the insulating film 6 was formed over the entire surface of the high strength base plate 5 in the illustrated embodiment, it is also possible to form film of different materials on the front and back surfaces of the high strength base plate 5 and the inner surface of the openings 5a. For instance, the film on the front and back surfaces of the high strength base plate 5 may consist of a highly insulating material while the film on the inner surface of the opening 5a may consist of a material demonstrating a high bonding force with respect to the holder hole forming portion 7, rather than a highly insulating property.

Figure 7A:
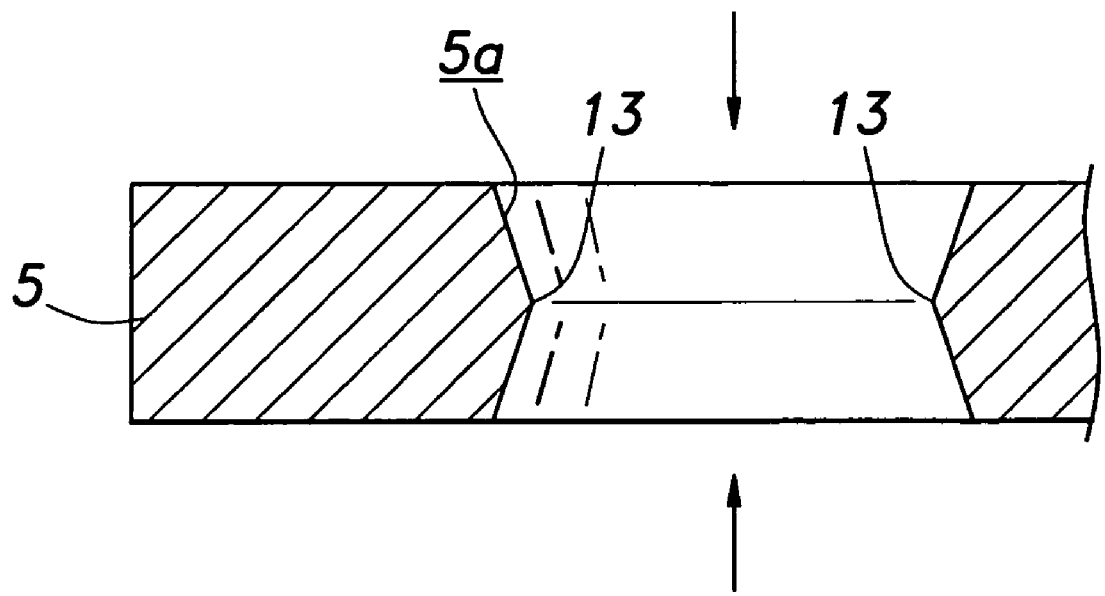
FIG. 7a is a view similar to FIG. 3a showing a projection formed in the opening.

As shown in FIG. 7, the openings 5a can be formed in the high strength base plate 5 by etching, and by conducting etching from both directions as indicated by the arrows in FIG. 7a, a ridge 13 that projects radially inward in an axially middle part of the openings and can serve as a means for preventing the dislodging of the holder hole forming portions 7 can be easily formed. This can be readily accomplished by using a base plate made from a silicon wafer, and anisotropically etching said inner circumferential surface of said opening, and no special work is required.

Figure 7B:
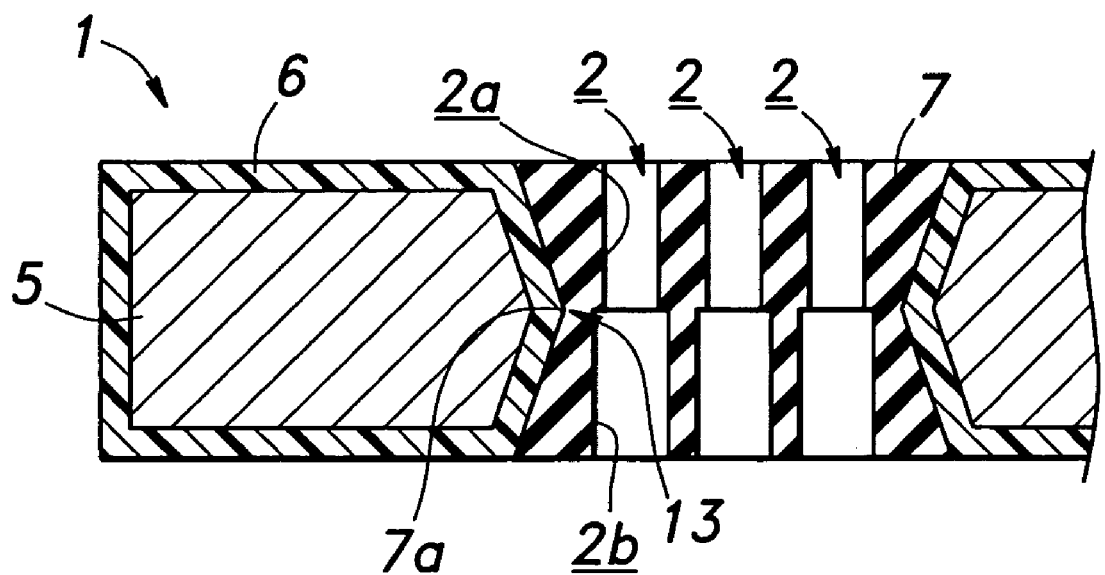
FIG. 7b is a view similar to FIG. 3d showing the installed state of the holder hole forming portion.
Figure 8:
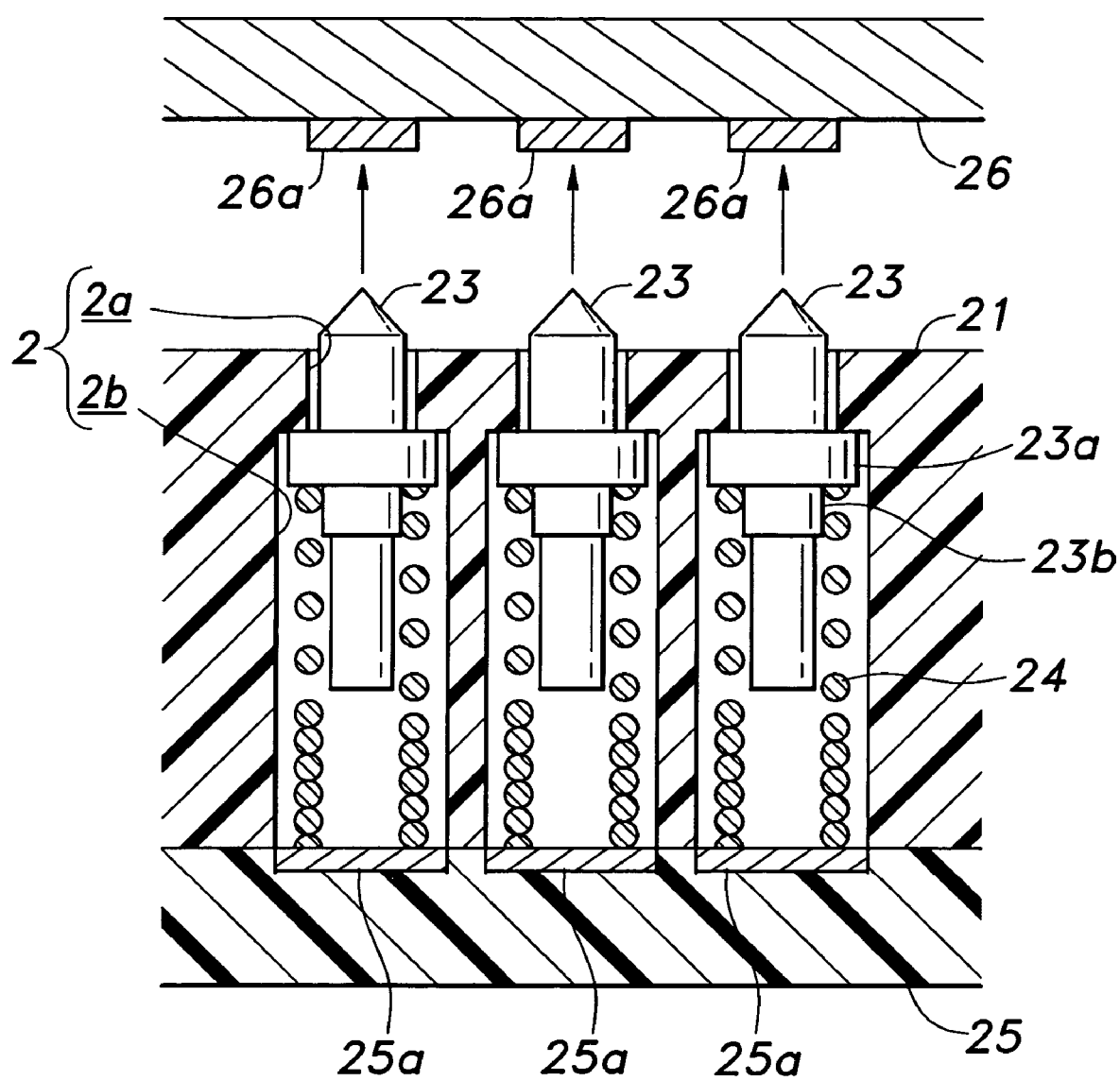
FIG. 8 is a fragmentary longitudinal sectional view of the conventional contact probe.
Figure 9:
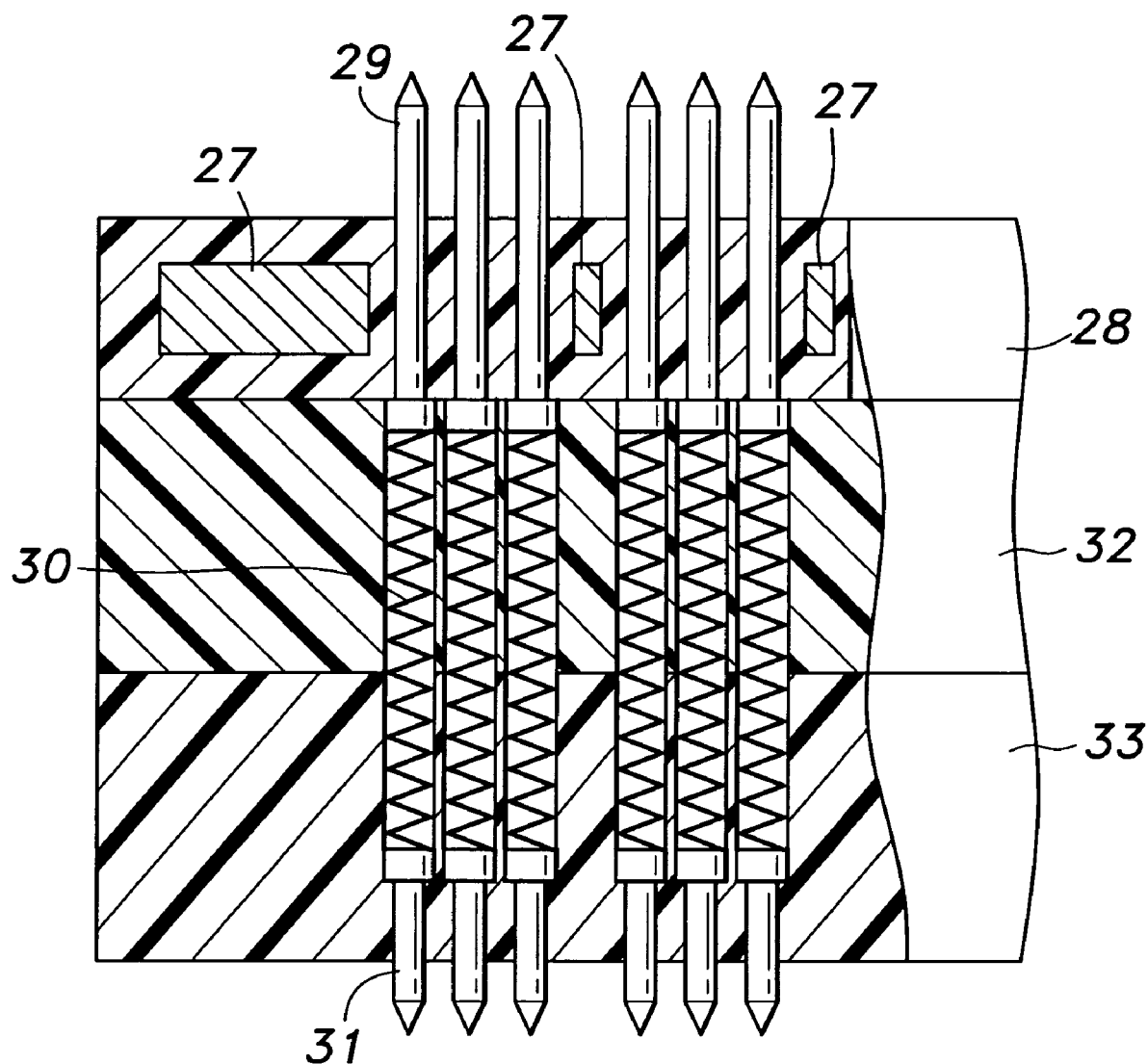
FIG. 9 is a fragmentary longitudinal sectional view of the conventional contact probe.

By filling the holder hole forming portion 7 in the opening 5a, a recess 7a corresponding to the ridge 13 is formed in the holder hole forming portion 7 as shown in FIG. 7b. Therefore, even when the holder hole forming portion 7 has shrunk over time, the engagement between the ridge 13 and recess 7a prevents the dislodging movement of the holder hole forming portion 7 (the axial direction of the opening 5a), and the holder hole forming portion 7 can be retained in a reliable fashion.

Thus, according to the present invention, when metallic material is used for the high strength base plate and plastic material is used for the holder hole forming portion, preferably by forming film on the inner circumferential surface of the opening to enhance a bonding force between the base plate and holder hole forming portion, there can be obtained an electroconductive contact probe holder having the high strength base plate and holder hole forming portions firmly joined together without requiring insert molding. This increases the proportion of the high strength base plate to the entire thickness of the holder, and the contact probe holder can be made almost as strong as the high strength base plate. Thus, the thickness of the high strength base plate can be minimized, and the favorable property of the material of the base plate can be favorably utilized. Therefore, even when the thickness of the contact probe holder is reduced, the reduction in the mechanical strength of the holder can be minimized as opposed to the conventional holder having a metallic member incorporated therein by insert molding, and this in turns allows the thickness of the holder to be reduced even further. In particular, because the holder holes for the contact probe can be formed in material suitable for forming such holes and a high positional accuracy can be achieved, the holder is highly suitable for use in contact probes for testing highly integrated chips.

By forming film on the inner circumferential surface of the opening to ensure electric insulation between the base plate and holder hole forming portion, even when the walls separating adjacent contact units get thinner on account of the increasingly dense population of the contact units and an electrostatic measure becomes necessary, it is possible to ensure a required level of insulation and use a material having a favorable electrostatic property for the holder hole forming portion.

When the opening is provided with a ridge or other projection for preventing the holder hole forming portion from coming off, by filling such material as thermoplastic resin material in the opening as a holder hole forming portion, a recess corresponding to the projection is formed in the holder hole forming portion. Thereby, even when the holder hole forming portion has shrunk over time due to the difference in the thermal expansion coefficient between the high strength base plate and holder hole forming portion, the engagement between the projection and recess prevents the dislodgement of the holder hole forming portion.

When the contact probe is used for conducting wafer level tests, in particular burn-in tests, the deformation of the holder as a whole owing to the thermal expansion of the high strength base plate may become too significant to be disregarded. This problem can be avoided by providing slits for accommodating deformation between adjacent openings that are provided in the high strength base plate in mutually parallel relationship. The slits accommodate the thermal deformation of the high strength base plate, and the positional accuracy of the contact units with respect to the individual chips in the wafer can be ensured. When the holder is retained by an outer frame, the slits can prevent the deformation of the holder into a dome-shape which otherwise could occur.

Although the present invention has been described in terms of preferred embodiments thereof, it is obvious to a person skilled in the art that various alterations and modifications are possible without departing from the scope of the present invention which is set forth in the appended claims.

The invention claimed is:

1. An electroconductive contact probe holder for supporting a plurality of contact units for contacting an object, comprising:
a base plate member made of a first material and provided with an opening therethrough, wherein said first material comprises a member selected from a group consisting of metallic material, semiconductor material, ceramic material and glass material; and
a holder hole forming member made of a second material and filled in said opening substantially without extending outside said opening;
a plurality of holder holes being passed across a thickness of said holder hole forming member each for receiving a contact unit therein.

2. The electroconductive contact probe holder according to claim 1, wherein said second material comprises a plastic material.

3. The electroconductive contact probe holder according to claim 1, wherein a film is formed over an inner circumferential surface of said opening.

4. The electroconductive contact probe holder according to claim 3, wherein said film is made of a material that promotes bonding between said holder hole forming member and said base plate.

5. The electroconductive contact probe holder according to claim 3, wherein said film is made of a material that promotes electric insulation between said holder hole forming member and said base plate.

6. An electroconductive contact probe holder for supporting a plurality of contact units for contacting an object, comprising:
a base plate member made of a first material and provided with an opening therethrough; and
a holder hole forming member made of a second material and filled in said opening substantially without extending outside said opening;
a plurality of holder holes being passed across a thickness of said holder hole forming member each for receiving a contact unit therein;
wherein a film is formed over an inner circumferential surface of said opening;
wherein an engagement feature is formed on the inner circumferential surface of said opening.

7. The electroconductive contact probe holder according to claim 6, wherein said base plate member is made of a silicon wafer and said engagement feature comprises an inwardly directed ridge formed by anisotropically etching said inner circumferential surface of said opening.

8. The electroconductive contact probe holder according to claim 6, wherein said film is made of a material that promotes electric insulation between said holder hole forming member and said base plate.

9. An electroconductive contact probe holder for supporting a plurality of contact units for contacting an object, comprising:
a base plate member made of a first material and provided with an opening therethrough; and
a holder hole forming member made of a second material and filled in said opening substantially without extending outside said opening;
a plurality of holder holes being passed across a thickness of said holder hole forming member each for receiving a contact unit therein;
wherein a stress relieving opening is formed adjacent said opening having said holder hole forming portion filled therein.

10. An electroconductive contact probe holder for supporting a plurality of contact units for contacting an object, comprising:
a base plate member made of a first material and provided with an opening therethrough, wherein a film is formed over an inner circumferential surface of said opening; and
a holder hole forming member made of a second material and filled in said opening substantially without extending outside said opening;
a plurality of holder holes being passed across a thickness of said holder hole forming member each for receiving a contact unit therein.

11. The electroconductive contact probe holder according to claim 10, wherein said first material comprises a member selected from a group consisting of metallic material, semiconductor material, ceramic material and glass material.

12. The electroconductive contact probe holder according to claim 10, wherein said second material comprises a plastic material.

13. The electroconductive contact probe holder according to claim 10, wherein said film is made of a material that promotes bonding between said holder hole forming member and said base plate.

14. The electroconductive contact probe holder according to claim 10, wherein said film is made of material that promotes electric insulation between said holder hole forming member and said base plate.

15. The electroconductive contact probe holder according to claim 10, wherein an engagement feature is formed on the inner circumferential surface of said opening.

16. The electroconductive contact probe holder according to claim 15, wherein said base plate member is made of a silicon wafer and said engagement feature comprises an inwardly directed ridge formed by anisotropically etching said inner circumferential surface of said opening.

17. The electroconductive contact probe holder according to claim 10, wherein a stress relieving opening is formed adjacent said opening having said holder hole forming portion filled therein.

18. The electroconductive contact probe holder according to claim 6, wherein said film is made of a material that promotes bonding between said holder hole forming member and said base plate.

* * * * *